US005355340A

United States Patent [19]

Coker et al.

[11] Patent Number: 5,355,340
[45] Date of Patent: Oct. 11, 1994

[54] SEMICONDUCTOR MEMORY WITH MULTIPLEXED REDUNDANCY

[75] Inventors: Thomas A. Coker, Irving; David C. McClure, Carrollton, both of Tex.

[73] Assignee: SGS-Thomson Microelectronics, Inc., Carrollton, Tex.

[21] Appl. No.: 101,347

[22] Filed: Aug. 2, 1993

Related U.S. Application Data

[63] Continuation of Ser. No. 627,823, Dec. 14, 1990, abandoned.

[51] Int. Cl.$^5$ ............................................. G11C 29/00
[52] U.S. Cl. .................................... 365/200; 365/225.7
[58] Field of Search .................... 365/189.02, 230.03, 365/200, 225.7, 230.02; 371/10.3

[56] References Cited

U.S. PATENT DOCUMENTS

| | | | |
|---|---|---|---|
| 4,228,528 | 10/1980 | Cenker et al. | 365/200 |
| 4,471,472 | 9/1984 | Young | 365/200 |
| 4,573,146 | 2/1986 | Graham et al. | 365/200 |
| 4,599,709 | 7/1986 | Clemons | 365/200 |
| 4,656,610 | 4/1987 | Yoshida et al. | 365/230.03 |
| 4,691,300 | 9/1987 | Pelley, III et al. | 365/200 |
| 4,817,056 | 3/1989 | Furutani et al. | 365/200 |
| 4,858,192 | 8/1989 | Tatsumi et al. | 365/200 |
| 4,984,205 | 1/1991 | Sugibayashi | 365/200 |
| 5,122,987 | 6/1992 | Kihara | 365/200 |

FOREIGN PATENT DOCUMENTS

| | | |
|---|---|---|
| 0361404 | 4/1990 | European Pat. Off. |
| 3906897 | 9/1989 | Fed. Rep. of Germany . |
| 2165971 | 9/1985 | United Kingdom . |

OTHER PUBLICATIONS

Hardee, et al., "A Fault-Tolerant 30 ns/375 mW 16K×1 NMOS Static RAM", *J. Solid State Circuits*, vol. SC-16, No. 5 (IEEE, 1981), pp. 435–43.

Childs, et al., "An 18 ns 4K×4 CMOS SRAM", *J. Solid State Circuits*, vol. SC-19, No. 5 (IEEE, 1984), pp. 545–551.

*Primary Examiner*—Eugene R. LaRoche
*Assistant Examiner*—Son Dinh
*Attorney, Agent, or Firm*—Rodney M. Anderson; Lisa K. Jorgenson; Richard K. Robinson

[57] ABSTRACT

An integrated circuit memory is disclosed which includes redundant columns associated with a sub-array, and in which multiple input/output terminals are placed in communication with multiple columns in the sub-array in read and write cycles. The number of redundant columns per sub-array is less than the number of input/output terminals. A multiplexer connects the selected redundant column to a selected sense amplifier and write circuit for the input/output with which the replaced column was associated. The multiplexer includes pass gates connected to the bit lines of the redundant column, and fuses connected between each of the pass gates and each of the sense/write circuits selectable for the redundant column. Those of the fuses which are not associated with the selected input/output are opened, and the fuses associated with the selected input-/output are left intact. Precharge transistors are connected to the fuse sides of the pass gates, for precharging each of the floating nodes after the pass gates are turned off. This precharging negates the effect of any charge which may be trapped on the fuse side of the pass gates for those lines where the fuses are opened, so that the access time for the next cycle will not be degraded.

9 Claims, 6 Drawing Sheets

SEMICONDUCTOR MEMORY WITH MULTIPLEXED REDUNDANCY

The present application is a continuation of copending application Ser. No. 07/627,823, filed Dec. 14, 1990, now abandoned.

This invention is in the field of semiconductor memories, and is more specifically directed to the use of redundant memory cells in semiconductor memories.

This application is related to application Ser. No. 627,403 filed contemporaneously herewith, and assigned to SGS-Thomson Microelectronics, Inc.

BACKGROUND OF THE INVENTION

Many types of semiconductor memories, including static random access memories (SRAMs), dynamic random access memories (DRAMs), FIFOs, dual-port memories, and read-only memories of various types, fabricated as individual components and embedded in other integrated circuits such as microprocessors and other logic devices, are containing greater numbers of storage locations, and higher capacity, as the manufacturing technology improves. For example, SRAMs having $2^{20}$ storage locations (i.e., 1 Mbits) and DRAMs having $2^{22}$ storage locations (i.e., 4 Mbits) are available in the market.

For the general commercial market, such a memory is usable only if each and every storage location can be accessed and can store both digital data states. Failure of a single storage location, or bit, thus causes the entire memory (and logic device having an embedded memory) to be non-salable. Considering the relatively large chip size and high manufacturing costs for the high density memories noted hereinabove, such memories are particularly vulnerable to the effect of extremely small (in some cases sub-micron) defects that cause single "stuck" bits.

As a result, many semiconductor memories are now fabricated with so-called redundant storage locations, which are enabled in the event of defects in the primary memory array. For ease of enabling, and also to address row or column defects, the redundant storage locations are generally formed as redundant rows or columns which, when enabled, replace an entire row or column of the primary memory array. The enabling of such redundant storage location is conventionally done during the manufacturing test process, where the primary memory is tested for functionality of the bits therein. The addresses of failing bits are logged, and an algorithm in the automated test equipment determines if the redundant rows or columns available on the circuit are sufficient to replace all of the failing bits. If so, fuses are opened (or, alternatively, anti-fuses may be closed) in the decoding circuitry of the memory so that the failing row or column is no longer enabled by its associated address value, and so that a redundant row or column is enabled by the address associated with the failing row or column. Examples of memory devices incorporating conventional redundancy schemes are described in Hardee, et al., "A Fault-Tolerant 30 ns/375 mW 16K×1 NMOS Static RAM", J. Solid State Circuits, Vol. SC-16, No. 5 (IEEE, 1981), pp. 435–43, and in Childs, et al., "An 18 ns 4K×4 CMOS SRAM", J. Solid State Circuits, Vol. SC-19, No. 5 (IEEE, 1984), pp. 545–51.

A major constraint in the design of a memory with redundancy is the chip area required to incorporate the redundant elements and associated decode circuitry. The choice of the number and arrangement of redundant elements depends upon a number of factors. The primary tradeoff is the cost of chip area versus the benefit of repairing otherwise failing devices. Based upon the types of defects (i.e., those which cause failing rows, those which cause failing columns, those which cause failing isolated bits, and those which cause the entire array to fail) and their expected frequency over the product life cycle, the tradeoff of number and arrangement of redundant cells versus chip area can be made.

Multiple input/output memories provide special problems in the implementation of redundant storage cells, as the redundant storage cells must be somehow associated with the various input/outputs. In memories which have the primary memory array arranged in multiple blocks, or sub-arrays, so that power dissipation can be reduced by selecting only one of the sub-arrays rather than the entire memory, all input/output terminals must be in communication with each of the sub-arrays. In prior memories so arranged, redundant elements, particularly columns, have been relatively inefficient as the same number of columns as input/output terminals have been associated with each sub-array or block, with each redundant column dedicated to one of the input/output terminals. As such, enabling of the redundant elements has required enabling of more redundant columns that may otherwise be necessary; furthermore, if a sub-array or block has failing cells associated with more than one column address, either two entire sets of columns must be provided, or else the memory cannot be repaired. It should be noted that with the number of input/output terminals increasing (with by-eight memories being commonplace), and with the number of storage cells in a memory becoming higher over time (with 1 Mbit SRAMs and 4 Mbit DRAMs being commonplace) such that segmentation of the memory array becomes more desirable from a power dissipation standpoint, dedication of redundant columns to individual input/output terminals becomes even more expensive from a chip area standpoint.

It is therefore an object of this invention to provide a memory having improved efficiency of use of redundant storage cells.

It is a further object of this invention to provide such a memory useful with multiple input/output terminals.

It is a further object of this invention to provide such a memory which includes a plurality of sub-arrays.

It is a further object of this invention to provide such a memory which has redundant storage cells associated with each of a plurality of sub-arrays.

SUMMARY OF THE INVENTION

The invention may be incorporated into a memory which has multiple output terminals. Redundant storage cells, for example redundant columns, are provided with the memory array, such that fewer redundant columns than outputs are provided. A redundancy multiplexer is provided which selects which output of the multiple outputs that each redundant column is to be in communication with when selected. The ability to assign outputs to the redundant columns reduces the number of redundant columns necessary, which in turn improves the layout efficiency of the memory, particularly where multiple sub-arrays are included within the array.

DETAILED DESCRIPTION OF THE PREFERRED EMBODIMENT

Figure 1:
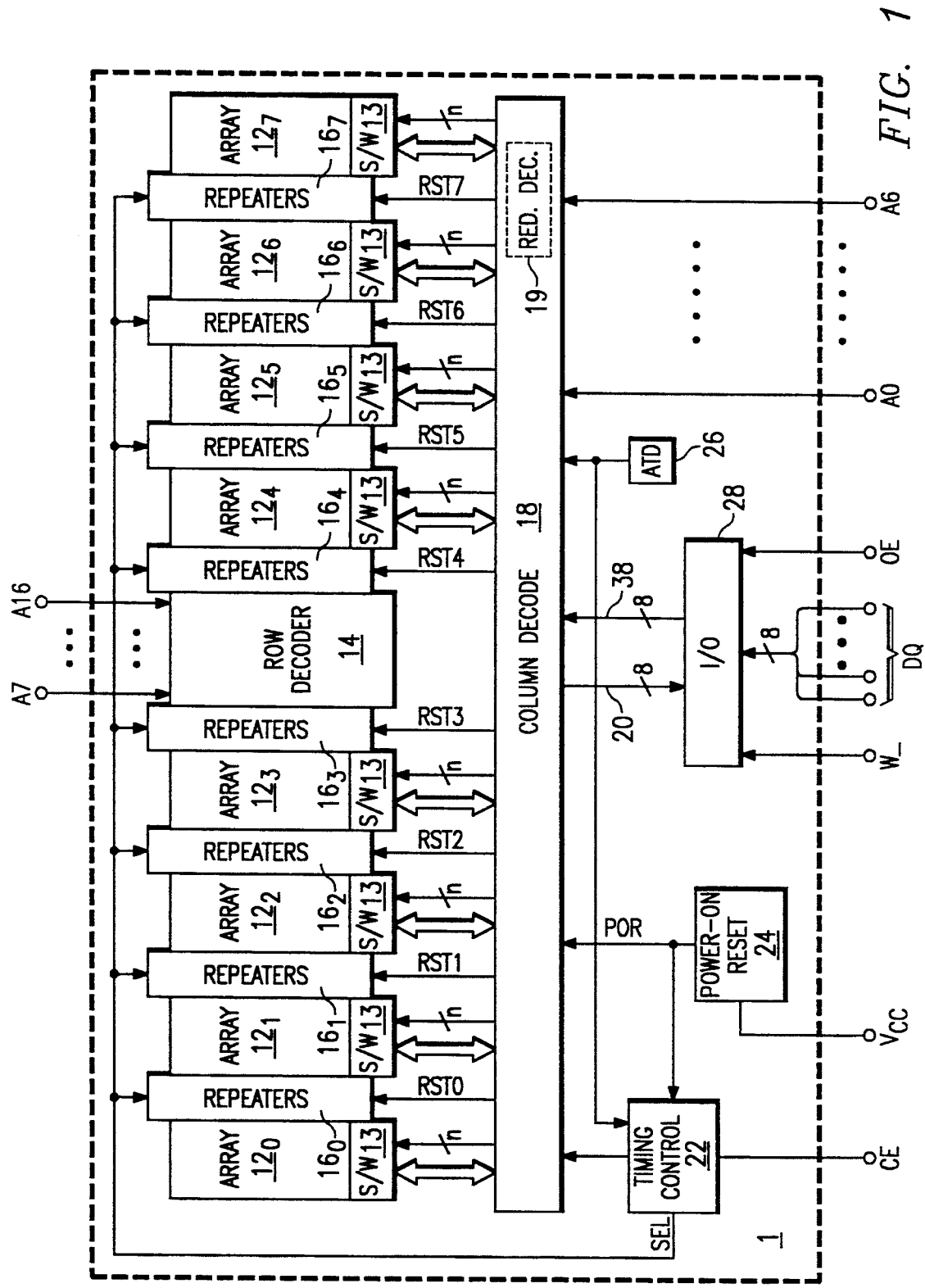
FIG. 1 is an electrical diagram, in block form, of a memory according to the preferred embodiment of the invention.

Referring now to FIG. 1, a block diagram of an integrated circuit memory 1 incorporating the preferred embodiment of the invention described herein will be described. Memory 1 is an integrated circuit memory, for example a static random access memory (SRAM), having $2^{20}$, or 1,048,576, storage locations or bits. Memory 1 in this example is a wide-word memory, organized as $2^{17}$, or 128k, addressable locations of eight bits each. Accordingly, for example in a read operation, upon the access of one of the memory locations, eight data bits will appear at the eight input/output terminals DQ. The electrical organization of memory 1, in this example, is 1024 rows of 1024 columns, with eight columns accessed in each normal memory operation.

In this example of memory 1, the memory array is divided into eight sub-arrays $12_0$ through $12_7$, each of which have 1024 rows and 128 columns. Memory 1 includes seventeen address terminals A0 through A16, for receiving the seventeen address bits required to specify a unique memory address. In the conventional manner, the signals from these seventeen address terminals are buffered by address buffers (not shown). After such buffering, signals corresponding to ten of the address terminals (A7 through A16) are received by row decoder 14, for selecting the one of the 1024 rows to be energized by row decoder 14.

FIG. 1 illustrates schematically the relative physical location of sub-arrays 12 relative to one another, and relative to row decoder 14. The selection of a row of memory cells in sub-arrays 12 is accomplished by row lines, one of which is driven from row decoder 14 according to the value of the row address at terminals A7 through A16. In an arrangement such as shown in FIG. 1 where row decoder 14 is located centrally, with sub-arrays 12 on either side thereof, it is preferred that the most significant column address bit (address terminal A6 in this embodiment) also be decoded by row decoder 14, so that the row line may be energized only on one side of the centrally located row decoder 14, according to this most significant column address bit. The energizing of a row line connects the contents of memory cells to their corresponding bit lines in the conventional manner. Sense/write circuits 13 are provided for sensing and storing the data state on the bit lines in sub-arrays 12, for communicating externally presented input data to the selected memory cells. It should be noted that many conventional arrangements and organization of sense/write circuits 13 may be utilized in memory 1 according to the invention, such arrangements including the assignment of one sense amplifier for each bit line pair, or the assignment of one sense amplifier for multiple bit line pairs, with the selection of which bit line pair is to be sensed made by column decoder 18 according to the column address. In addition, write paths and circuits separate from the sense amplifiers may alternatively be provided.

For purposes of reducing the power consumed during active operation, in this embodiment only one of the sub-arrays 12 remains energized during each active cycle, with the selection of the sub-array 12 which remains energized determined by the desired memory address (i.e., three bits of the column address). This is done by repeaters 16, which are provided between sub-arrays 12, and also between row decoder 14 and sub-arrays $12_3$ and $12_4$. Repeaters 16 pass along the energized state of the selected row line, latch the energized state of the selected row line for the selected sub-array 12, and de-energize the row line for sub-arrays 12 which are not selected. This arrangement requires that all eight bits of the accessed memory location are located in the same sub-array 12.

It should be noted that, for purposes of this invention, it is not essential or necessary that the eight bits of the accessed memory location must be located in the same sub-array 12, or that latched repeaters 16 be provided between sub-arrays 12. As described in my copending application Ser. No. 588,577, filed Sep. 26, 1990 and assigned to SGS-Thomson Microelectronics, Inc., however, such organization is preferred as it provides for reduced active power dissipation without the disadvantages attendant with time-out of the word lines or of multiple metal level implementations.

Signals corresponding to the remaining seven address terminals (A0 through A6) are received by column decoder 18 to control repeaters 14 to maintain selection of one of sub-arrays 12 by way of lines RST0 through RST7. Column decoder 18 also selects the desired columns in the selected sub-array 12 responsive to the remainder of the column address value, in the conventional manner. While single lines are indicated for the communication of the address value to row decoder 14 and column decoder 18, it should be noted that, as in many conventional memories, both true and complement values of each address bit may alternatively be communicated from the address buffers to the decoders, for ease of decoding.

As illustrated in FIG. 1, redundant column decoder 19 is provided as part of the column decoder 18. In memory 1 according to this embodiment, redundant columns are provided which are associated with each array, as will be described hereinbelow in further detail. Redundant decoder 19 includes conventional fuses, such as polysilicon fuses, which are opened by a laser, electrical overstress, or other conventional techniques, in order to enable a redundant column to be selected for a column address value, and to disable the columns in sub-arrays 12 which include failing memory cells. An example of a conventional circuit for use as redundancy decoder 19 is described in U.S. Pat. No. 4,573,146, issued Feb. 25, 1986, assigned to SGS-Thomson Microelectronics, Inc., and incorporated herein by this reference. In the conventional manner, redundant decoder 19 thus receives the appropriate ones of the column address bits, and selects the redundant column in lieu of a column in a selected sub-array 12, responsive to the column address value at terminals A0 through A6 matching the address of a column to be replaced.

It should, of course, be apparent that, alternatively or in addition to the redundant columns, redundant rows of memory cells may be provided in memory 1. In the conventional manner, row decoder 14 (and repeaters 16, as applicable) thus would include a redundancy decode similarly enabled, by way of fuses, to select a redundant row in lieu of a primary row.

Further included in memory 1 according to this embodiment of the invention, is input/output circuitry 28, which is in communication with column decoder 18 via an eight-bit output bus 20 and an eight-bit input bus 38, and which is also in communication with input/output terminals DQ, with write enable terminal W—, and with output enable terminal OE. Input/output circuitry 28 includes conventional circuitry for providing and controlling communication between input/output terminals DQ and the memory cells selected according to the address value presented to memory 1, and accordingly will not be described in further detail herein. It should be noted that many other alternative organizations of memory 1, relative to the input/output width, and including dedicated rather than common input/output terminals, may also utilize the present invention.

Memory 1 further includes timing control circuitry 22, which controls the operation of various portions of memory 1 during a memory cycle in the conventional manner. It should be noted that timing control circuitry 22 is generally not a particular block of circuitry, as suggested by FIG. 1, but generally is distributed within memory 1 to control the operation of various portions therein. Timing control circuitry 22 receives, for example, signals from terminal CE which enables and disables the operation of memory 1. As shown in FIG. 1, line SEL from timing control circuitry 22 is connected to repeaters 16, for control thereof as described in said copending application Ser. No. 588,577.

It should also be noted that, as in some conventional static memories, timing control circuitry 22, and other circuit blocks such as column decoder 18, are controlled by address transition detection circuit 26 so that memory 1 operates dynamically, in response to transitions at address terminals A0 through A16. Copending application Ser. No. 601,287, filed Oct. 22, 1990 and assigned to SGS-Thomson Microelectronics, Inc., incorporated herein by this reference, describes an address transition detection circuit as may be used as address transition detection circuit 24, and which also control the buffering of the address signals received at address terminals A0 through A16. It should be noted that the use of address transition detection to control the precharge and equilibration of the bit lines is preferred in this embodiment of the invention, as will be described hereinbelow. It should also be noted that use of address transition detection to control repeaters 16 dynamically within a cycle, as described in said copending application Ser. No. 588,577, is also preferred.

Memory 1 further includes a power-on reset circuit 24. Power-on reset circuit 24 receives bias voltage from power supply terminal $V_{cc}$ (as of course do other portions of memory 1 by connections not shown), and generates a signal on line POR indicating that the $V_{cc}$ power supply has reached a sufficient level upon memory 1 initially powering up, to prevent portions of memory 1 from powering-up in an indeterminate or undesired state. As will be described hereinbelow, and as described in copending application Ser. No. 569,000, filed Aug. 17, 1990, incorporated herein by this reference, said application assigned to SGS-Thomson Microelectronics, Inc., power-on reset circuit 24 may similarly also control other portions of memory 1, as suggested by the connection of line POR to timing control circuitry 22 in FIG. 1. Said copending application Ser. No. 569,000 also describes preferred configurations of power-on reset circuit 24, although for purposes of this invention conventional power-on reset circuits may also be used.

As noted above, for purposes of reducing power consumption, memory 1 according to this embodiment energizes only one of the eight sub-arrays 12, selected according to the three most significant column address bits. In this embodiment, repeaters 16 are present between sub-arrays 12, and also between row decoder 14 and each of sub-arrays $12_3$ and $12_4$, for maintaining the application of the energized row line within the selected sub-array 12 and, after a period of time, de-energizing the row line in the other sub-arrays 12. In this way, the column address (particularly the three most significant bits) controls the application of the word line so that only that portion of the word line in the selected sub-array 12 is energized for the entire memory operation cycle. Column decoder 18 also selects eight of the 128 columns in the selected sub-array 12, according to the value of the remaining bits of the column address. In this embodiment, also for purposes of reducing active power consumption, only those sense/write circuits 13 in the selected sub-array 12 which are associated with the desired memory bits are energized. Sense/write circuits 13 so selected by column decoder 18 are then placed in communication with input/output circuitry 28 via bus 20 or bus 38, as the case may be, through which the reading of data from or writing of data to the selected memory cells may be done in the conventional manner. Said copending application Ser. No. 588,577, incorporated herein by this reference, provides a detailed description of the construction and operation of repeaters 16.

Of course, many alternative organizations of memory 1 may be used in conjunction with the invention described herein. Examples of such organizations would include wide-word memories where each sub-array is associated with one of the input/output terminals, and memories where the entire array is energized during normal operation. Other memory types such as dynamic RAMs, EPROMs, embedded memories, dual-port RAMs, FIFOs, and the like, each with organization of their own, may also benefit from this invention.

It should also be noted that other physical and electrical arrangements of the sub-arrays 12 may be alternatively be used with the present invention. For example, two row decoders 14 may be incorporated into memory 1, each of which controls the application of a row line signal into half of the memory. Row decoder or decoders 14 may also be located along one edge of sub-arrays 12, rather than in the middle thereof as shown in FIG. 1. It is contemplated that the particular layout of memory 1 will be determined by one of ordinary skill in the art according to the particular parameters of interest for the specific memory design and manufacturing processes.

Figure 2:
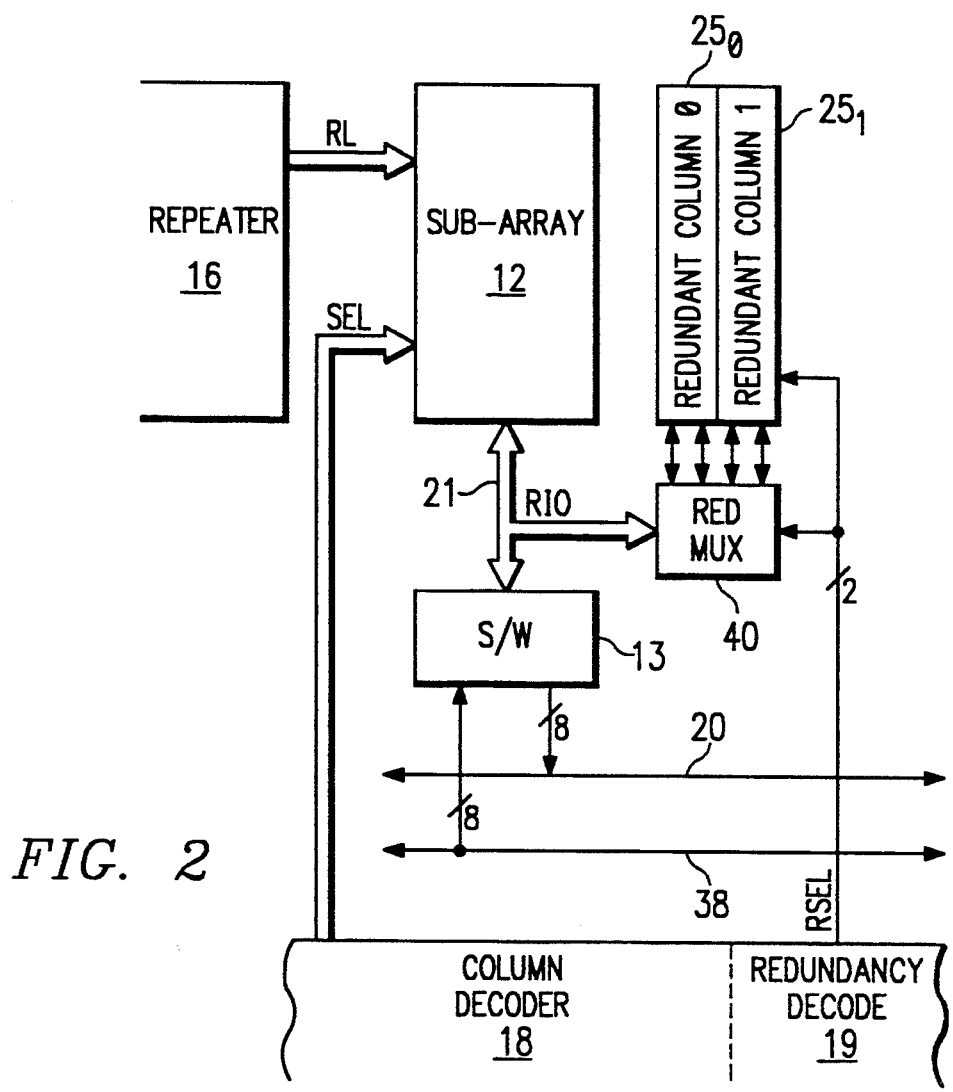
FIG. 2 is an electrical diagram, in block form, of a sub-array in the memory of FIG. 1 and its redundant columns.

Referring now to FIG. 2, the arrangement of redundant columns in memory 1 according to the preferred embodiment of the invention will now be described. FIG. 2 illustrates one of sub-arrays 12 of memory 1, together with the sense/write circuits 13 associated therewith. Also associated with this sub-array 12, and with each of sub-arrays 12 in memory 1, are two redundant columns 25. Accordingly, for memory 1 having eight sub-arrays 12, sixteen redundant columns 25 are provided. In this exemplary embodiment of the invention, the two redundant columns 25 which are associated with a sub-array 12 may only replace columns in its associated sub-array 12, and cannot be used to replace columns in other sub-arrays 12.

In the arrangement of FIG. 2, repeater 16 presents a row line in row line bus RL to sub-array 12, for selection of a row of memory cells therein. As described hereinabove, all eight bits of the selected memory location in this by-eight embodiment of memory 1 are selected from the same sub-array 12, in order to reduce active power dissipation. Column decoder 18 presents column select signals on bus SEL to sub-array 12, so that when sub-array 12 is selected, eight columns in sub-array 12 will have their bit lines connected to I/O bus 21, for communication to the eight sense/write circuits 13 associated with sub-array 12. The eight sense/write circuits 13 for sub-array $12_n$ each receive a differential signal on a pair of I/O lines 21 from their associated selected column in sub-array $12_n$. In this embodiment, each of sense/write circuits 13 in FIG. 2 include circuitry for sensing the data state of the bit lines connected thereto, and also for writing data to the bit lines connected thereto. Accordingly, each of sense/write circuits 13 is in communication with input/output circuitry 28 via both input data bus 38 and output data bus 20. Construction of sense/write circuits 13, including such sensing and write circuitry, will be described in further detail hereinbelow; it should be noted that, for purposes of this invention, other sense amplifier arrangements may alternatively be used, including separate write and sense circuitry.

As a result of the configuration of FIG. 2, each of the columns in sub-array $12_n$ is associated with a single sense/write circuit 13, and accordingly with a single data terminal DQ. The assignment of individual sense/write circuits 13 to particular columns in a sub-array 12 may be done in any way convenient for purposes of layout. For example, the 128 columns in a sub-array 12 may be grouped into eight contiguous blocks of sixteen columns each, with each column in a block associated with the same sense/write circuit 13 and data terminal DQ; alternatively, each column in a group of eight adjacent columns may be assigned to a different sense/write circuit 13 and data terminal DQ from the others in its group of eight.

Since there are fewer redundant columns 25 (i.e., two) than sense/write circuits 13 (i.e., eight) in the arrangement of FIG. 2, redundant multiplexers 40 are provided for connecting redundant columns 25 to the appropriate sense/write circuits 13 via I/O bus 21, depending upon which columns in sub-array 12 are being replaced by a redundant column 25. The construction of redundant multiplexers 40 will be described in further detail hereinbelow; for purposes of description of FIG. 2, however, it is useful that fuses are provided within redundant multiplexers 40 to indicate with which of the eight sense/write circuits 13 a particular redundant column 25 is to be associated. Control lines RSEL from redundant decoder 19 are connected to redundancy multiplexer $40_0$ to enable the selection of redundant columns 25 upon receipt of the column address of the column in sub-array 12 replaced by redundant columns 25. Redundancy multiplexers 40 are in communication with sense/write circuits 13 via redundant I/O bus RIO, which is connected between redundancy multiplexers 40 and I/O bus 21.

In this embodiment, it should be noted that, for purposes of layout efficiency, each individual redundant column 25 may be connected with only four of the eight sense/write circuits 13. Accordingly, if sub-array 12 has defects in two columns associated with the same sense/write circuit 13 (or with sense/write circuits 13 which are in the same group of four servable by an individual redundant column 25), the memory cannot be repaired by redundant columns 25. For this embodiment, based on yield and defect models, it has been determined that the likelihood of such a defect is sufficiently small such that it is efficient to take advantage of the reduced layout complexity of such assignment, risking loss of some memories due to such a defect. Alternatively, redundant multiplexers 40 could be constructed so that each redundant column 25 is assignable to any of the eight sense/write circuits. It is contemplated that other arrangements and grouping of the redundant columns 25 should now be apparent to those of ordinary skill in the art.

Figure 3:
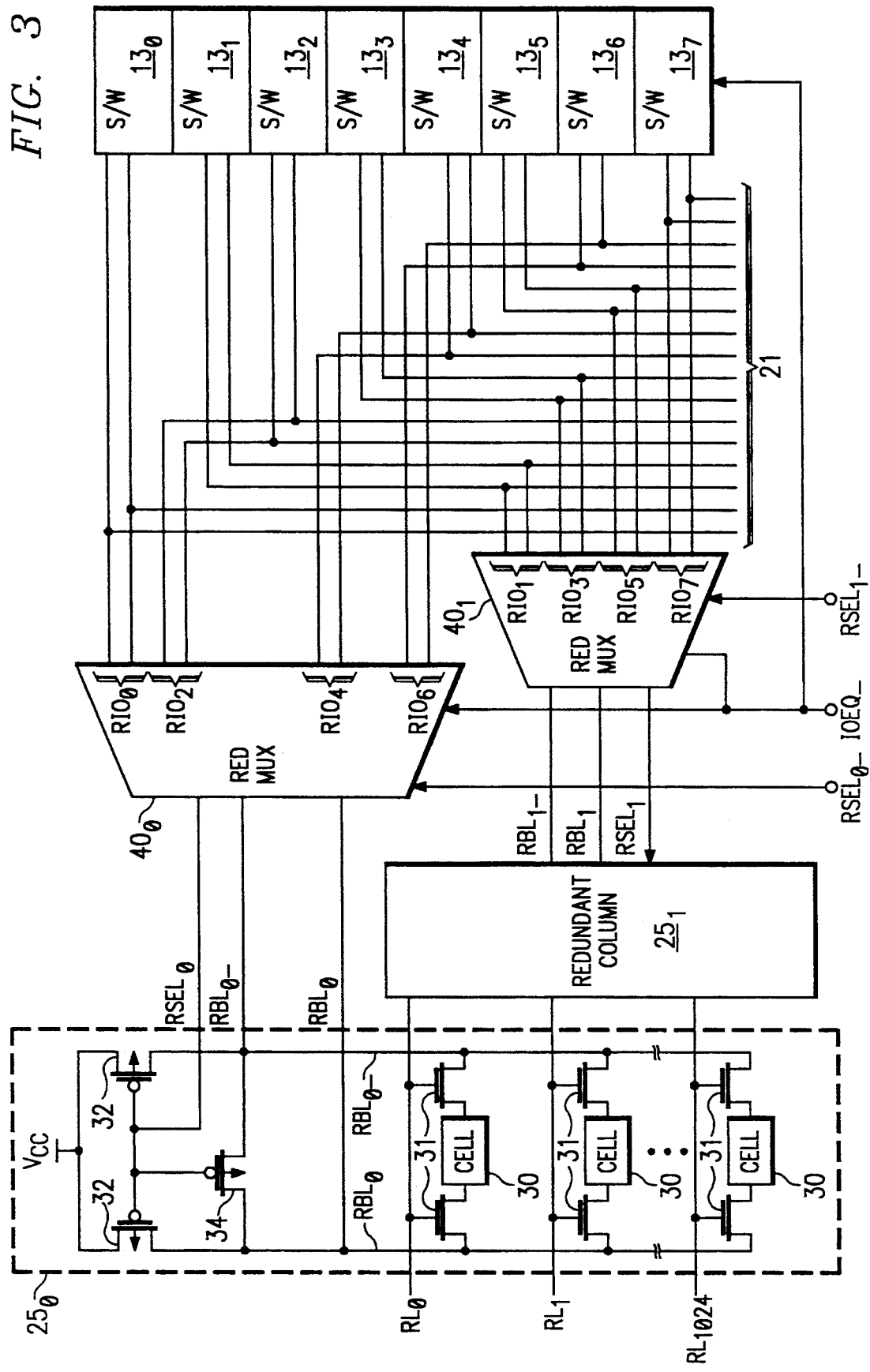
FIG. 3 is an electrical diagram, in schematic and block form, illustrating the communication between the sense/write circuitry and the redundant columns in the memory of FIG. 1.

Referring now to FIG. 3, the construction and operation of redundant columns 25, and their communication with sense/write circuits 13, will be described in further detail. As shown in FIG. 3, redundant column $25_0$ is constructed in conventional manner for an SRAM; it should be noted that columns in sub-arrays 12 and redundant column $25_1$ (shown in block form in FIG. 3) are similarly constructed as redundant column $25_1$. Redundant column $25_0$ includes, in this example, 1024 memory cells 30, each connectable to differential bit lines $RBL_0$ and $RBL_{0\_}$ by way of pass gates 31; pass gates 31 for each of the 1024 memory cells 30 are controlled by an associated row line RL, such that the enabling of one of the 1024 row lines RL will cause pass gates 31 for one and only one memory cell 30 in redundant column $25_0$ to be connected to bit lines $RBL_0$ and $RBL_{0\_}$. Row lines RL are common for all columns in the sub-array 12, and for redundant columns $25_0$ and $25_1$, as illustrated in FIG. 3.

Bit lines $RBL_0$ and $RBL_{0\_}$ in redundant column $25_0$ are each connected to the drain of a p-channel transistor 32; the sources of transistors 32 are connected to a precharge voltage, which in this case is $V_{cc}$, and the gates of transistors 32 are controlled by line $RSEL_0$, which is issued by redundant multiplexer $40_0$ as will be described hereinbelow. Transistors 32 precharge bit lines $RBL_0$ and $RBL_{0\_}$ when line $RSEL_0$ is at a low logic level, which occurs when redundant column $25_0$ is not selected. P-channel equilibration transistor 34 has its source-to-drain path connected between bit lines $RBL_0$ and $RBL_{0\_}$, and its gate connected to line $RSEL_0$, so that during such time as line $RSEL_0$ is low (i.e., during precharge via transistors 32), bit lines $RBL_0$ and $RBL_{0\_}$ are equilibrated to the same potential, which in this case is $V_{cc}$.

Bit lines $RBL_0$ and $RBL_{0\_}$ are connected to redundancy multiplexer $40_0$, which controls the application of bit lines $RBL_0$ and $RBL_{0\_}$ to a selected one of sense/write circuits 13. The selection of the sense/write circuit 13 to which bit lines $RBL_0$ and $RBL_{0\_}$ are connected is determined by fuses within redundancy multiplexer $40_0$ which are selectively opened, as will be described in further detail hereinbelow. As noted hereinabove, redundant column $25_0$ is associated, by way of redundant multiplexer $40_0$, with four of the eight sense/write circuits 13 for its sub-array 12; similarly, redundant column $25_1$ is associated with the other four of the eight sense/write circuits 13, through its redundant multiplexer $40_1$. In this example, redundant column $25_0$ can be placed in communication with one of sense/write circuits $13_0$, $13_2$, $13_4$, and $13_6$; conversely, redundant column $25_1$ can be placed in communication with one of sense/write circuits $13_1$, $13_3$, $13_5$, and $13_7$.

To accomplish this function, redundant multiplexer $40_0$ can present the state of bit lines $RBL_0$ and $RBL_{0\_}$ at any of four differential pair of bus lines in bus RIO. These four pair of bus lines are shown in FIG. 3 at output $RIO_0$ which is connected to sense/write circuit $13_0$, output $RIO_2$ which is connected to sense/write circuit $13_2$, output $RIO_4$ which is connected to sense/write circuit $13_4$, and output $RIO_6$ which is connected to sense/write circuit $13_6$. The operation of redundant multiplexer $40_0$ is controlled by line $RSEL_{0\_}$ from redundant decoder 19 in column decoder 18. Line $RSEL_{0\_}$ is driven to its active low state upon redundant decoder 19 recognizing that the column address presented to memory 1 matches the address of the column to be replaced by redundant column $25_0$; responsive to line $RSEL_{0\_}$ being at a low logic level, bit lines $RBL_0$ and $RBL_{0\_}$ will be connected to the one of outputs RIO indicated by the fuses therein, and accordingly to the lines of I/O bus 21 which are connected to the selected sense/write circuit 13. Sense/write circuit 13 will sense data from, or write data to, the selected memory cell 30 in redundant column in the conventional manner.

When the column address presented to memory 1 does not match the address of the column to be replaced by redundant column $25_0$, redundant decoder 19 in column decoder 18 will cause line $RSEL_{0\_}$ to be driven to a high logic level. Responsive to line $RSEL_{0\_}$ being high, bit lines $RBL_0$ and $RBL_{0\_}$ will not be connected to I/O bus 21, and redundant multiplexer $40_0$ will issue a low logic level on line $RSEL_0$ to redundant column $25_0$, turning on precharge transistors 32 and equilibration transistor 34.

In this embodiment of the invention, redundant multiplexer $40_0$ also receives a signal on line IOEQ_ from timing control circuitry 22, for precharging particular nodes therewithin, as will be described in further detail hereinbelow.

Figure 4:
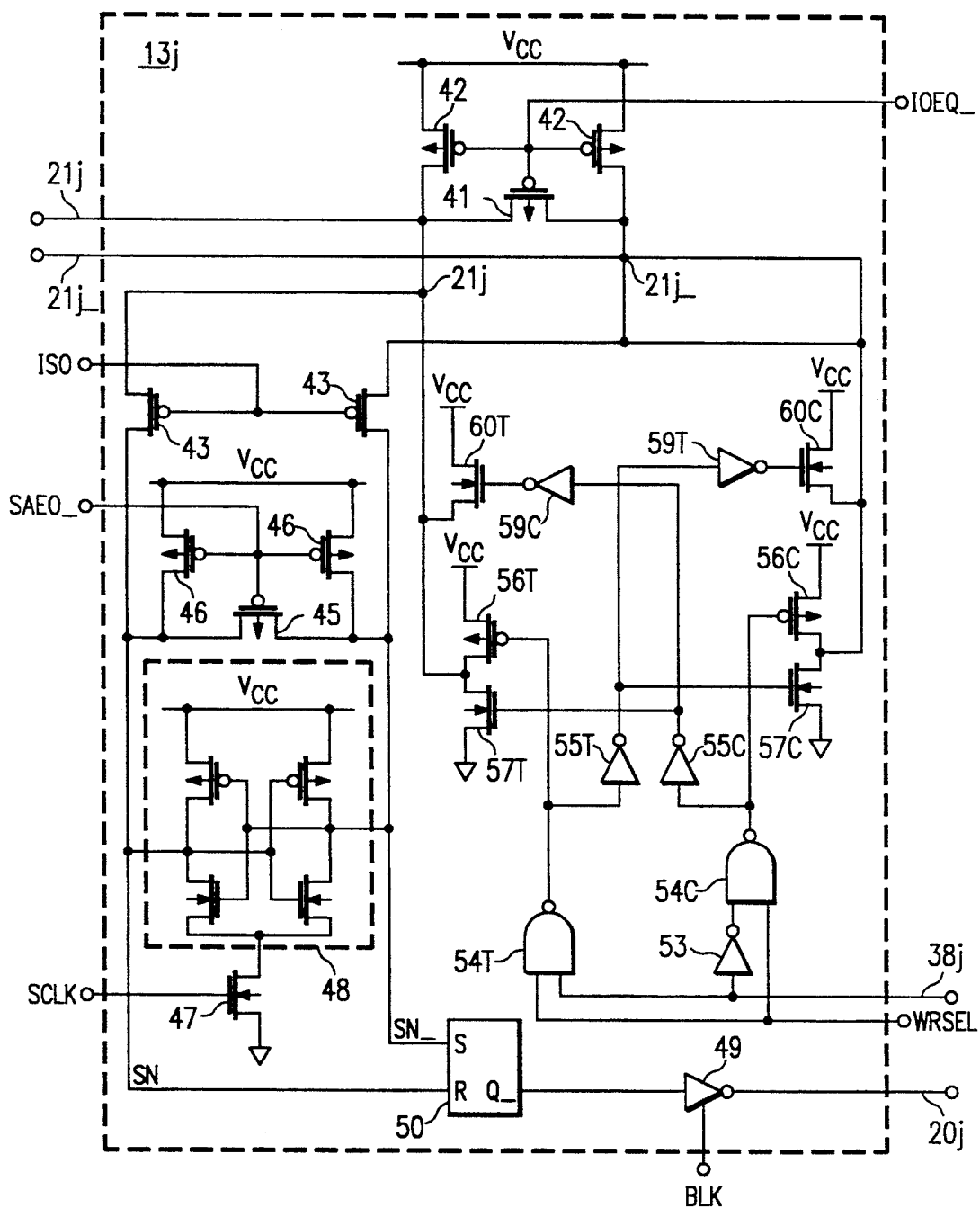
FIG. 4 is an electrical diagram, in schematic form, of the sense and write circuitry in the memory of FIG. 1.

Referring now to FIG. 4, the construction of a sense/write circuit $13_j$, including both read and write paths, will now be described. Complementary input/output lines $21_j$ and $21_{j\_}$ from I/O bus 21 are each connected to the drain of a p-channel precharge transistor 42; the sources of transistors 42 are both connected to the precharge voltage for the input/output lines $21_j$ and $21_{j\_}$, which in this case is $V_{cc}$. Input/output lines $21_j$ and $21_{j\_}$ are also connected to one another by p-channel equilibration transistor 41. The gates of transistors 41 and 42 are connected to line IOEQ_, which is generated by timing control circuitry 22 responsive to an address transition detected by ATD circuit 26, or to such other events during the cycle for which equilibration of input/output lines 21 are desired.

On the read side of sense/write circuit $13_j$, input/output lines $21_j$ and $21_{j\_}$ are each connected to a p-channel pass transistor 43, each of pass transistors 43 having its gate controlled by an isolate signal ISO. Accordingly, input/output lines $21_j$ and $21_{j\_}$ may be isolated from the read circuitry by line ISO at a high logic level, and may be connected thereto by line ISO at a low logic level. The complementary lines on the opposite side of pass transistors 43 from input/output lines $21_j$ and $21_{j\_}$ are referred to in FIG. 4 as sense nodes SN and SN_, respectively.

Sense nodes SN and SN_ are also preferably precharged and equilibrated during the appropriate portion of the cycle, as sense amplifier 48 within sense/write circuit 13 operates in dynamic fashion, as will be described hereinbelow. P-channel precharge transistors 46 each have their source-to-drain paths connected between $V_{cc}$ and sense nodes SN and SN_, respectively. Equilibration transistor 45 is a p-channel transistor having its source-to-drain path connected between sense nodes SN and SN_. The gates of transistors 45 and 46 are all controlled by line SAEQ_ which, when at a low level, precharges and equilibrates sense nodes SN and SN_ in similar manner as described above relative to bit lines BL and BL_ and input/output lines $21_j$ and $21_{j\_}$.

Sense amplifier 48 is a conventional CMOS latch consisting of cross-coupled inverters therewithin; the inputs and outputs of the cross-coupled latches are connected to sense nodes SN and SN_ in the conventional manner. N-channel pull-down transistor 47 has its source-to-drain path connected between the sources of the n-channel transistors in sense amplifier 48 and ground, and has its gate controlled by line SCLK.

Pull-down transistor 47 provides dynamic control of sense amplifier 48, so that the sensing of sense nodes SN and SN_ is performed in dynamic fashion. As is well known in dynamic RAMs, the dynamic sensing in this arrangement is controlled with transistor 47 initially off at the time that pass transistors 43 connect sense nodes SN and SN_ to input/output lines $21_j$ and $21_{j\_}$; during this portion of the cycle, sense amplifier 48 is presented with a small differential voltage between sense nodes SN and SN_. After development of this small differential voltage, line SCLK is driven high, so that the sources of the pull-down transistors in sense amplifier 48 are pulled to ground. This causes sense amplifier 48 to develop a large differential signal on sense nodes SN and SN_, and latch the sensed state of sense nodes SN and SN_.

In this arrangement, sense nodes SN and SN_ are communicated to output bus 20 by way of R-S flip-flop 50; the set input of flip-flop 50 receives sense node SN_, and the reset input of flip-flop 50 receives sense node SN. The Q_ output of flip-flop 50 is connected, via inverter 49, to line $20_j$ of output bus 20. Inverter 49 causes the logic state communicated to output bus 20 to be consistent with the polarity of bit lines BL and BL_ designated in this description. Inverter 49 preferably has a control input controlled by column decoder 18 (shown on line BLK of FIG. 4), so that inverter 49 is tri-stated when sub-array 12 with which sense/write circuit $13_j$ is associated is not selected by column decoder 18.

It should be noted that other ones of sense/write circuit $13_j$ are present in memory 1, and are associated with output bus line $20_j$ in similar manner as sense/write circuit $13_j$ of FIG. 4, but for different sub-arrays 12. All of sense/write circuits $13_j$ associated with this line of output bus 20 are connected in wired-OR fashion. Accordingly, the control signals ISO, SAEQ_, and SCLK which are presented to the read side of sense/write circuit $13_j$ are preferably, in this embodiment, generated by column decoder 18 in conjunction with timing control circuitry 22. Such generation of these control signals provides that the ones of sense/write circuit $13_j$ associated with unselected ones of sub-arrays 12 are not enabled (by lines ISO maintained high, and lines SAEQ_ and SCLK maintained low) so as to maintain their sense nodes SN and SN_ equilibrated and precharged to $V_{cc}$, preventing bus conflict on output bus 20.

Looking now to the write side of sense/write circuit $13_j$, line $38_j$ from input bus 38, and write control signal WRSEL from column decoder 18, are received by the inputs to NAND gates 54T and 54C (with line $38_j$ inverted by inverter 53 prior to its connection to NAND gate 54C). Write control signal WRSEL is generated according to the logical AND of selection of the sub-array 12 with which sense/write circuit $13_j$ is associated, together with the appropriate timing signal from timing control circuitry 22 to effect the write operation at the appropriate time in the cycle, as is well known.

The output of NAND gate 54T controls the gate of a p-channel pull-up transistor 56T connected in push-pull fashion with an n-channel pull-down transistor 57T; the output of NAND gate 54T is also connected, via inverter 55T, to the gate of an n-channel pull-down transistor 57C which is connected in push-pull fashion with p-channel pull-up transistor 56C. Similarly, the output of NAND gate 54C is connected directly to the gate of pull-up transistor 56C, and is connected via inverter 55C to the gate of pull-down transistor 57T. The drains of transistors 56T and 57T drive input/output line $21_j$, and the drains of transistor 56C and 57C drive input/output line $21_{j-}$.

Accordingly, the write side of sense/write circuit $13_j$ operates as a complementary pair of tri-state drivers. The drivers present a high-impedance state to input/output lines $21_j$ and $21_{j-}$ responsive to write control line WRSEL being at a low logic level, as this places the outputs of both of NAND gates 54T and 54C at a high logic level, turning off all of transistors 56T, 56C, 57T, and 57C. Write control line WRSEL is, of course, at such a low logic level during read cycles, and during write cycles to sub-arrays 12 other than the one associated with sense/write circuit $13_j$.

According to this preferred embodiment, source followers are also provided on the write side of sense/write circuit $13_j$. N-channel transistor 60T has its source connected to input/output line $21_j$ and has its drain biased to $V_{cc}$; the gate of transistor 60T is controlled by the output of NAND gate 54C, inverted twice by inverters 55C and 59C. Similarly, n-channel transistor 60C has its source connected to input/output line $21_{j-}$ and has its drain biased to $V_{cc}$; the gate of transistor 60T is controlled by the output of NAND gate 54T, inverted twice by inverters 55T and 59T.

The source followers of transistors 60T and 60C are provided in order to assist in the pull up of input/output lines $21_j$ and $21_{j-}$ after a write operation and before a read operation (often referred to as "write recovery"). In operation, during a write operation, the one of input/output lines $21_j$ and $21_{j-}$ that is driven to a low level by pull-down transistor 57 will also have its associated source follower transistor 60 off (due to the inversion from inverter 59); source follower transistor 60 will be on for the other input/output line which is driven high by its pull-up device 56. Upon write control line WRSEL returning to a low logic level at the end of the write operation, the outputs of both of NAND gates 54 will be high, and accordingly the transistor 60 which was not previously on will be turned on. This will pull up its associated input/output line $21_j$ from its prior low level toward the voltage $V_{cc}$-$V_t$ ($V_t$ being the threshold voltage of transistor 60). Precharge transistors 42, once turned on, will pull up input/output lines $21_j$ and $21_{j-}$ fully to $V_{cc}$; once the voltages of input/output lines $21_j$ and $21_{j-}$ reach a voltage above $V_{cc}$-$V_t$, transistors 60 will have no further effect.

It should be noted that both of source follower transistors 60 will remain on during read operations. Accordingly, input/output lines $21_j$ and $21_{j-}$ are clamped so that their voltages cannot fall below the level of $V_{cc}$-$V_t$. However, it should be noted that $V_t$ in this embodiment is on the order of 1.25 volts. Since input/output lines 21 and bit lines BL and BL are precharged to $V_{cc}$, the selected memory cell 30 connected to bit lines BL and BL_ will thus create a differential voltage between input/output lines $21_j$ and $21_{j-}$ on the order of $V_t$. This differential voltage can be easily sensed by sense amplifier 48. Therefore, the provision of source follower transistors 60 provide improved write recovery with little impact on the read operation.

Figure 5:
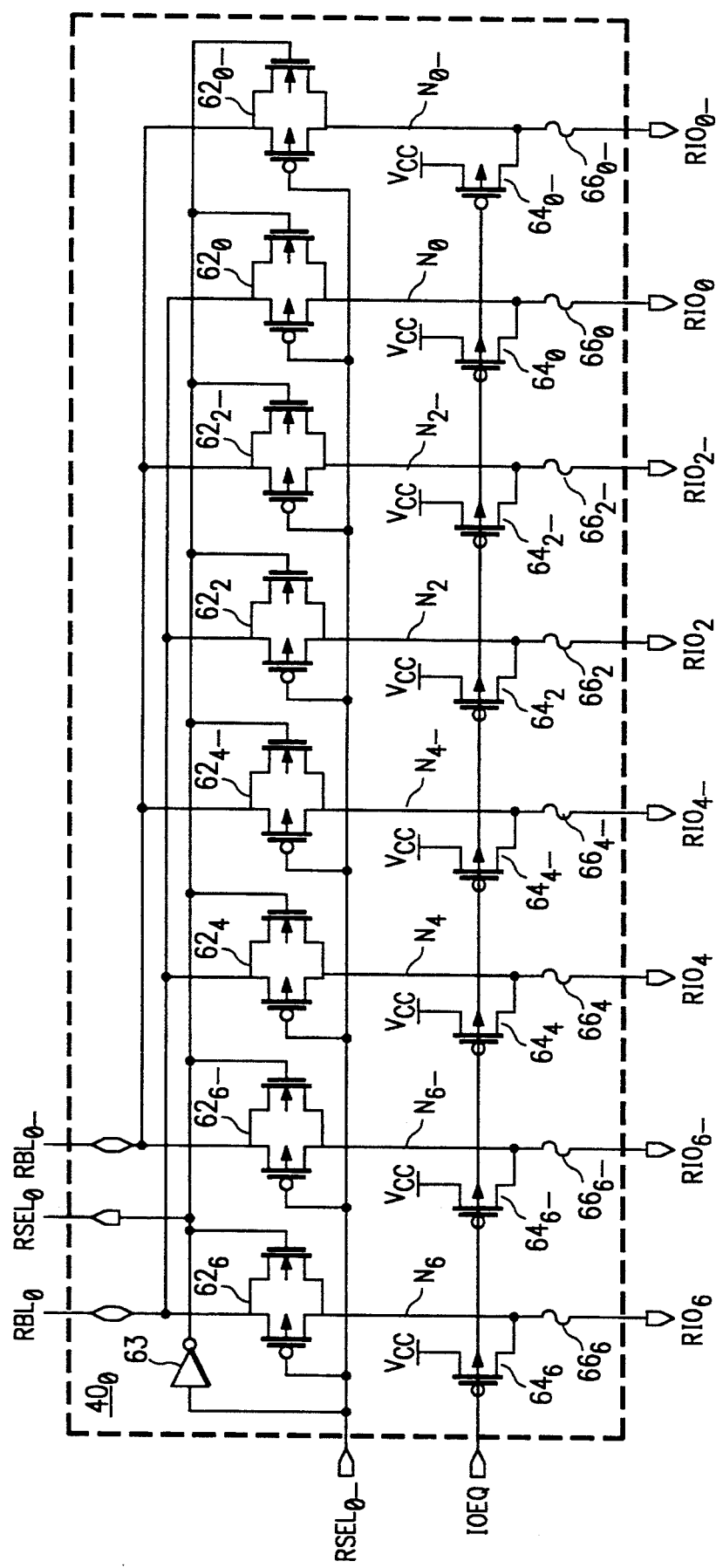
FIG. 5 is an electrical diagram, in schematic form, of the redundancy multiplexer in the memory of FIG. 1.

Referring now to FIG. 5, the construction of redundancy multiplexers 40 according to the preferred embodiment of the invention will now be described in detail, using redundancy multiplexer $40_0$ as an example. As shown in FIG. 3 described hereinabove, redundancy multiplexer $40_0$ receives bit lines $RBL_0$ and $RBL_{0-}$ from redundant column $25_0$. Pass gates $62_0$, $62_2$, $62_4$, and $62_6$ are connected on one side to fuses $66_0$, $66_2$, $66_4$, and $66_6$, respectively, and on the other side to bit line $RBL_0$; similarly, pass gates $62_{0-}$, $62_{2-}$, $62_{4-}$, and $62_{6-}$ are connected on one side to fuses $66_{0-}$, $66_{2-}$, $66_{4-}$, and $66_{6-}$, respectively, and on the other side to bit line $RBL_{0-}$. Each of pass gates 62 are constructed as n-channel and p-channel transistors having their source-to-drain paths connected in parallel with one another. The gate of each of the p-channel transistors in pass gates 62 is connected to line $RSEL_{0-}$ from column decoder 18, and the gate of each of the n-channel transistors in pass gates 62 is connected to line $RSEL_0$ at the output of inverter 63, which inverts line $RSEL_{0-}$. Line $RSEL_0$ from the output of inverter 63 is also connected to the gates of precharge transistors 32 and equilibration transistor 34 in redundant column $25_0$, as shown in FIG. 3.

Fuses 66 select which lines of bus RIO that bit lines $RBL_0$ and $RBL_{0-}$ are to be connected when redundant column $25_0$ is selected. In this example, all fuses 66 other than the two which are associated with the selected sense/write circuit 13 are opened by way of a laser to control this selection. For example, if redundant column $25_0$ is to replace a column in sub-array 12 which is associated with sense/write circuit $13_2$, fuses $66_0$, $66_{0-}$, $66_4$, $66_{4-}$, $66_6$, and $66_{6-}$ are all opened, and fuses $66_2$ and $66_{2-}$ are left intact. As a result, upon column decoder 18 selecting redundant column $25_0$ by driving line $RSEL_{0-}$ low, all pass gates 62 will be turned on, and bit lines $RBL_0$ and $RBL_{0-}$ will be connected, via pass gates $62_2$ and $62_{2-}$ and intact fuses $66_2$ and $66_{2-}$, to output lines $RIO_2$ and $RIO_{2-}$, respectively. Lines $RIO_2$ and $RIO_{2-}$ are connected, as shown in FIG. 3, to lines $21_2$ and $21_{2-}$ of I/O bus 21, and thus to sense/write circuit $21_2$ in the manner shown in FIG. 4.

According to the preferred embodiment of the invention, redundancy multiplexers 40 include circuitry for precharging the nodes therein which are connected between the fuses 66 and pass gates 62. Referring to FIG. 5, this circuitry is implemented by p-channel precharge transistors 64, each of which has its drain coupled to node N in redundancy multiplexer $40_0$, between an associated pass gate 62 and fuse 66. For example, precharge transistor $64_6$ has its drain connected to node $N_6$ between pass gate $62_6$ and fuse $66_6$. Each of precharge transistors 64 also has its source connected to the precharge voltage, which in this case is $V_{cc}$, and has its gate connected to line IOEQ__, which is the same signal described hereinabove for equilibrating the I/O lines 21 and 21__ in sense/write circuit 13. Accordingly, during such time in the memory cycle that I/O lines 21 and 21__ are being precharged, the nodes to which the drains of precharge transistors 64 are connected are similarly being precharged to $V_{cc}$.

Alternatively (or in addition to) precharging nodes N in redundancy multiplexer 40, equilibration of nodes N for a given pair of redundant input/output lines RIO and RIO__ can also serve to reduce differential trapped charge thereat for the unselected input/output pair. For example, a p-channel transistor could be provided for each input/output pair RIO and RIO__, having its source-drain path connected between its associated input/output lines RIO and RIO__, and having its gate connected to line IOEQ__, such that it is conductive during the input/output bus equilibration period. Equilibration of nodes N would remove the differential component of trapped charge thereat, so that the selection of the associated redundant column by line $RSEL_{0\_}$ would not place a differential voltage on the bit lines of the redundant column $25_0$. It should be noted that providing such equilibration of nodes N (without precharge), while effective in removing the differential trapped charge, would likely result in an offset voltage being applied to the bit lines of the redundant column $25_0$, which would have to be taken into account by the sense and write circuitry for the column. It is therefore contemplated that equilibration of nodes N, in lieu of precharging, would be preferred primarily in those cases where the layout could easily accommodate one transistor, but could not easily accommodate the two precharge transistors 64 shown in the embodiment of FIG. 5.

Figure 6:
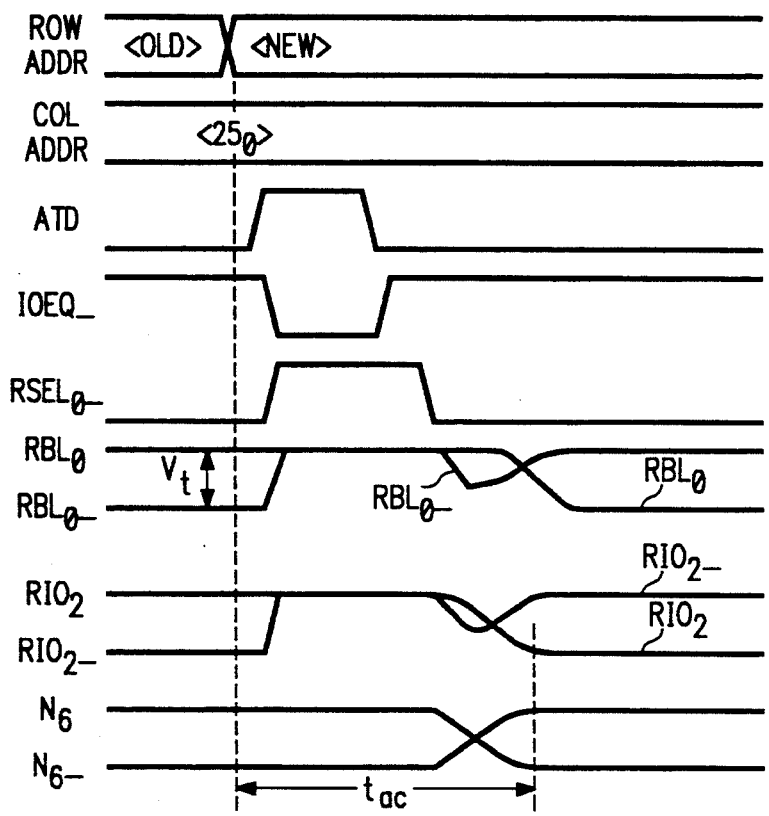
FIG. 6 is a timing diagram illustrating the operation of a redundancy decoder in the absence of the precharge and equalization therein.
Figure 7:
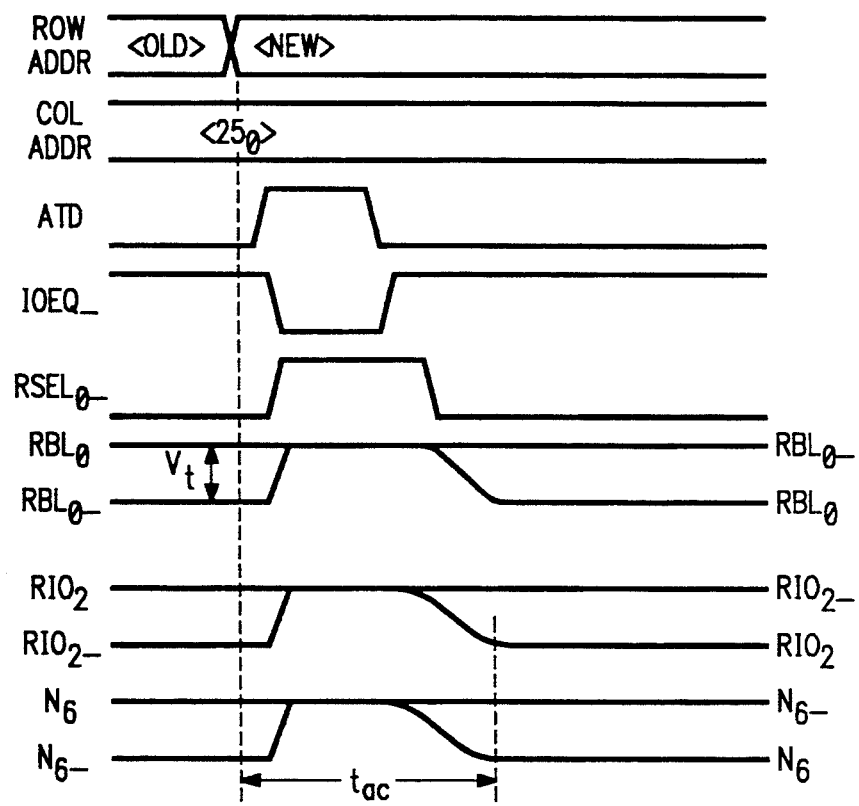
FIG. 7 is a timing diagram illustrating the operation of the redundancy multiplexer according to the preferred embodiment of the invention.

Referring to FIGS. 6 and 7, the benefit of such precharging in maintaining the time required to access redundant columns 25 as close as possible to the time required to access a column in sub-array 12 will now be described. FIG. 6 illustrates the operation of redundancy multiplexer 40 for a sequence of read operations, if it were implemented without precharge transistors 64. For purposes of explanation, the references to lines and nodes in FIG. 6 will be made relative to elements of the redundancy multiplexer $40_0$ of FIG. 5; as noted hereinabove, however, the operation illustrated in FIG. 6 is that of a multiplexer not including precharge transistors 64. The sequence described in FIG. 6 illustrates the case of successive reads of two memory cells 30, both in redundant column $25_0$ but in different rows, and where the data states stored in the accessed memory cells are opposite from one another.

The sequence of FIG. 6 begins with the completion of a read of a memory cell in redundant column $25_0$ containing a "1" data state. As a result, bit line $RBL_0$ is high relative to bit line $RBL_{0\_}$; it should be noted that the differential signal between bit lines $RBL_0$ and $RBL_{0\_}$ is on the order of an n-channel transistor threshold voltage, as discussed hereinabove. For purposes of this example, fuses $66_2$ and $66_{2\_}$ are intact, and all six of the other fuses 66 are open, so that sense/write circuit $13_2$ is being selected. Accordingly, at the end of the first read cycle of FIG. 6, output line $RIO_2$ is at a high level, and line $RIO_{2\_}$ is at a low logic level, according to the state of bit lines $RBL_0$ and $RBL_{0\_}$, communicating the differential signal to sense/write circuit $13_2$. Since all of pass gates 62 are on, those nodes N which are associated with fuses 66 that are open will follow the state of output lines $RIO_2$ and $RIO_{2\_}$. As shown in FIG. 6, for example, node $N_6$ is at a high logic level and node $N_{6\_}$ is at a low logic level.

Upon transition of the row address, address transition detection circuit 26 issues a pulse on line ATD. As noted hereinabove, this causes various control signals to issue, including, as shown in FIG. 6, line IOEQ__ going to a low logic level and line $RSEL_{0\_}$ going to a high logic level. As a result of the address transition, therefore, all of pass gates 62 are turned off, and bit lines $RBL_0$ and $RBL_{0\_}$ are precharged and equilibrated by the operation of line $RSEL_{0\_}$ going high (and line $RSEL_0$ going low). Similarly, referring to the construction of the sense/write circuit $13_j$ shown in FIG. 4, I/O lines 21 and 21__ are precharged and equilibrated responsive to line IOEQ__ going low; accordingly, lines $RIO_2$ and $RIO_{2\_}$ are precharged and equilibrated to $V_{cc}$.

However, since fuses $66_6$ and $66_{6\_}$ are open, with pass gates $62_6$ and $62_{6\_}$ turned off by line $RSEL_{0\_}$ going high responsive to the pulse on line ATD, nodes $N_6$ and $N_{6\_}$ are left to float, retaining the voltage to which they were driven during the prior cycle (subject eventually to leakage therefrom). As a result, the pulse on line ATD resulting from the change of the row address traps charge on those nodes N associated with opened fuses 66.

The trapped charge on nodes N associated with opened fuses 66 will slow a subsequent access of redundant column $25_0$, where the data state on bit lines $RBL_0$ and $RBL_{0\_}$ is opposite from that of the prior cycle. This is illustrated in FIG. 6 as occurring upon the end of the pulse on line ATD, which causes line IOEQ__ to return to a high logic level and which enables column decoder 18 to issue a low logic level on line $RSEL_{0\_}$ (since, in this example, the column address has remained the same). Responsive to line $RSEL_{0\_}$ returning to a low logic level, bit lines $RBL_0$ and $RBL_{0\_}$ receive the data state from the selected memory cell 30 associated with the new row address, and pass gates 62 are all turned back on. However, the opposite date state being presented on bit lines $RBL_0$ and $RBL_{0\_}$ in this cycle must overcome the trapped charge on the nodes N associated with opened fuses 66, such trapped charge being of the opposite data state from the prior cycle. For the example where six fuses 66 are opened, this stored charged state is present on nodes $N_0$, $N_{0\_}$, $N_4$, $N_{4\_}$, $N_6$, and $N_{6\_}$.

As shown in FIG. 6, the trapped charge on nodes $N_0$, $N_{0\_}$, $N_4$, $N_{4\_}$, $N_6$, and $N_{6\_}$ may be of such magnitude that a false differential is established on bit lines $RBL_0$ and $RBL_{0\_}$. This false differential results from charge sharing which occurs among all nodes N and N__, together with the selected redundant input/output lines $RIO_2$ and $RIO_{2\_}$ and bit lines $RBL_0$ and $RBL_{0\_}$. Time is thus required for the bit lines $RBL_0$ and $RBL_{0\_}$ to overcome the false differential (sensing of which would communicate incorrect data to the outputs) and to present the valid new data state on lines $RIO_2$ and $RIO_2\_$. The access time $t_{ac}$ between the time that lines $RIO_2$ and $RIO_2\_$ present the new data state after the transition of the address value, shown in FIG. 6, thus includes this delay time. While the above example is shown in the case of a read operation following a read operation, it should be noted that a read operation following a write operation will be subject to an even longer delay time, as the input/output lines are generally driven to a larger differential voltage (e.g., a rail-to-rail differential) in write operations than in read operations (e.g., a differential on the order of an n-channel transistor threshold voltage).

Referring now to FIG. 7, the operation of redundancy multiplexer $40_0$ of FIG. 5, including precharge transistors 64, for the same read of opposite data states from different cells in redundant column $25_0$ in successive cycles will be illustrated. The operation of redundancy multiplexer $40_0$ according to this embodiment of the invention for the initial cycle in the sequence of FIG. 7 is the same as shown in FIG. 6.

However, due to the inclusion of precharge transistors 64, those of nodes N which are associated with opened ones of fuses 66 do not float, but are precharged to $V_{cc}$ responsive to line IOEQ_ going to a low level to equilibrate the lines in I/O bus 21. The precharging of nodes $N_6$ and $N_6\_$ (and the others of nodes N associated with opened fuses 66) to $V_{cc}$ thus occurs substantially at the same time as the precharge and equilibration of bit lines $RBL_0$ and $RBL_0\_$, and I/O bus 21 (resulting in the equilibration of lines $RIO_2$ and $RIO_2\_$ as shown in FIG. 6).

Upon the completion of the pulse on line ATD, and the selection of the memory cell 30 in the new row of redundant column $25_0$ (the column address staying constant in this example), the differential voltage on bit lines $RBL_0$ and $RBL_0\_$ developed by the selected memory cell 30 develops on lines $RIO_2$ and $RIO_2\_$ without having to overcome trapped charge on any of nodes N. As a result, the access time $t_{ac}$ at which a sufficient differential signal is developed on lines $RIO_2$ and $RIO_2\_$ is shorter than that in the case shown in FIG. 6, due to the operation of precharge transistors 64.

The construction of the circuitry for selecting which data terminal DQ is associated with redundant columns in the memory according to this embodiment of the invention thus reduces delay in communication of the data state from a selected memory cell in a redundant column. As a result, the number of redundant columns implemented in the memory may be selected according to the yield versus chip area tradeoff noted hereinabove, as the performance impact of providing selection circuitry by which the redundant column is placed in communication with one of multiple data terminals is minimized according to the instant invention.

It should be noted that, while the above description illustrates precharge to $V_{cc}$, and thus preferably uses p-channel transistors for such precharge, precharge to other voltages using different transistor types, and other circuitry, will provide similar improvement in the access time performance of the memory, either as a integrated memory circuit or as an embedded memory in a logic device, such as a microprocessor, logic array, or the like. It should also be noted that, while the above description pertains to a static RAM device, the benefits of the invention may also be obtained by its use in other memory styles and types, such as dynamic RAMs, read-only memories such as ROMSs, EPROMs, and EEPROMs, and other memory configurations such as FIFOs and dual-port memories.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An integrated circuit with a memory, comprising:
   an array of storage cells arranged in rows and columns;
   a plurality of output terminals;
   means for accessing a plurality of storage cells in said array, selected according to an address signal, for communication with said plurality of output terminals;
   a plurality of redundant storage cells arranged in first and second redundant columns and associated with said array;
   a first and second redundant bit lines, for communicating the data state of one of said plurality of redundant storage cells in said first and second redundant columns, respectively, when selected;
   a first redundant output select circuit, coupled between the first redundant column and a first group of said plurality of output terminals, for coupling the selected redundant memory cell in the first redundant column to a selected one of the first group of output terminals so that, responsive to said address signal indicating that one of said plurality of redundant storage cells in the first redundant column are to be selected, said one of said plurality of redundant storage cells is in communication with the selected one of the first group of output terminals comprising:
      a first plurality of pass gates, each having a conduction path connected on a first side to said first redundant bit line and having a control terminal controlled according to said address signal; and
      a first plurality of fuses, each associated with one of the first group of output terminals, and connected in series between its associated output terminal and a second side of the conduction path of one of the first plurality of pass gates; and
   a second redundant output select circuit, coupled between the second redundant column and a second group of said plurality of output terminals, for coupling the selected redundant memory cell in the second redundant column to a selected one of the second group of output terminals so that, responsive to said address signal indicating that one of said plurality of redundant storage cells in the second redundant column are to be selected, said one of said plurality of redundant storage cells is in communication with the selected output terminal comprising:
      a second plurality of pass gates, each having a conduction path connected on a first side to said second redundant bit line and having a control terminal controlled according to said address signal; and a second plurality of fuses, each associated with one of the second group of output terminals, and connected in series between its associated output terminal and a second side of the conduction path of one of the second plurality of pass gates;

wherein those of the first and second plurality of fuses not associated with a selected output terminal are opened, and the ones of the first and second plurality of fuses associated with selected ones of the first and second groups of output terminals, respectively, are maintained closed.

2. The integrated circuit of claim 1, wherein each of said first and second redundant output select circuits comprise a multiplexer.

3. The integrated circuit of claim 1, wherein said means for accessing comprises:
a decoder, for receiving said address signal and for selecting selected ones of said plurality of storage cells for communication with said output terminals.

4. The integrated circuit of claim 3, further comprising:
a redundant decoder, for receiving said address signal and for selecting one of said redundant storage cells in said first redundant column or in said second redundant column for communication with the output terminals selected by its associated first or second redundant output select circuit.

5. The integrated circuit of claim 4, wherein said decoder comprises:
a row decoder, for selecting a row of said plurality of storage cells according to a row address signal; and
a column decoder, for selecting storage cells in said selected row for communication with said output terminals according to a column address signal.

6. The integrated circuit of claims 5, further comprising:
a redundant column decoder, for receiving said address signal and for selecting one of said redundant storage cells in said first redundant column or in said second redundant column for communication with the output terminals selected by its associated first or second redundant output select circuit responsive to said column address signal indicating that one of said redundant storage cells is to be selected.

7. The integrated circuit of claim 1, wherein said array of storage cells comprises a plurality of sub-arrays.

8. The integrated circuit of claim 6, wherein all of the storage cells selected by said address are located in the same sub-array.

9. The integrated circuit of claim 8, wherein each of said sub-arrays is associated with a plurality of said redundant storage cells.

* * * * *